(12) United States Patent
Shutkin et al.

(10) Patent No.: US 8,923,413 B2
(45) Date of Patent: Dec. 30, 2014

(54) OPTIMIZATION OF DATA PROCESSORS WITH IRREGULAR PATTERNS

(71) Applicant: LSI Corporation, Milipitas, CA (US)

(72) Inventors: Yurii S. Shutkin, Moscow (RU); Ilya V. Neznanov, Moscow (RU); Andrey P. Sokolov, Moscow (RU); Pavel A. Panteleev, Moscow Oblast (RU); Elyar E. Gasanov, Moscow (RU)

(73) Assignee: LSI Corporation, San Jose, CA (US)

( * ) Notice: Subject to any disclaimer, the term of this patent is extended or adjusted under 35 U.S.C. 154(b) by 176 days.

(21) Appl. No.: 13/706,698

(22) Filed: Dec. 6, 2012

(65) Prior Publication Data
US 2013/0235907 A1 Sep. 12, 2013

(30) Foreign Application Priority Data
Mar. 12, 2012 (RU) .................... 2012109385

(51) Int. Cl.
*H04B 1/7073* (2011.01)
*H04L 1/00* (2006.01)
*H03M 13/00* (2006.01)

(52) U.S. Cl.
CPC ............ *H04B 1/7073* (2013.01); *H04L 1/0067* (2013.01); *H03M 13/635* (2013.01)
USPC ......................................................... 375/242

(58) Field of Classification Search
CPC .. H04B 1/7073; H04L 1/0067; H04L 1/0068; H04L 1/0069; H03M 13/635; H03M 13/6356; H03M 13/6362; H03M 13/6368
USPC ..................... 375/242, 225; 370/505; 341/95; 714/752, 790, 786
See application file for complete search history.

(56) References Cited

U.S. PATENT DOCUMENTS

| | | | |
|---|---|---|---|
| 6,370,669 B1 * | 4/2002 | Eroz et al. ...................... | 714/774 |
| 6,675,347 B1 * | 1/2004 | Razoumov et al. ........... | 714/790 |
| 6,819,718 B1 * | 11/2004 | Koehn et al. .................. | 375/242 |
| 7,145,917 B1 * | 12/2006 | Qian ............................. | 370/465 |
| 2004/0181618 A1 * | 9/2004 | Dottling et al. ................ | 710/33 |
| 2005/0141549 A1 * | 6/2005 | Dottling et al. ............... | 370/465 |
| 2007/0140326 A1 * | 6/2007 | Singh ............................ | 375/225 |
| 2012/0110406 A1 * | 5/2012 | Sun et al. ...................... | 714/751 |

* cited by examiner

*Primary Examiner* — Aristocratis Fotakis

(57) ABSTRACT

In described embodiments, data streams with irregular patterns are processed by transformations defined by recursively changing processor state, or iteration level. The data transformations are applied to an arbitrary long portion of data, instead of small portions, that are defined directly by a current processor state. Embodiments combine small parts of, for example, puncturing/repetition patterns into a pattern of bigger parts and apply these patterns of bigger parts to relatively large portions of input data.

17 Claims, 8 Drawing Sheets

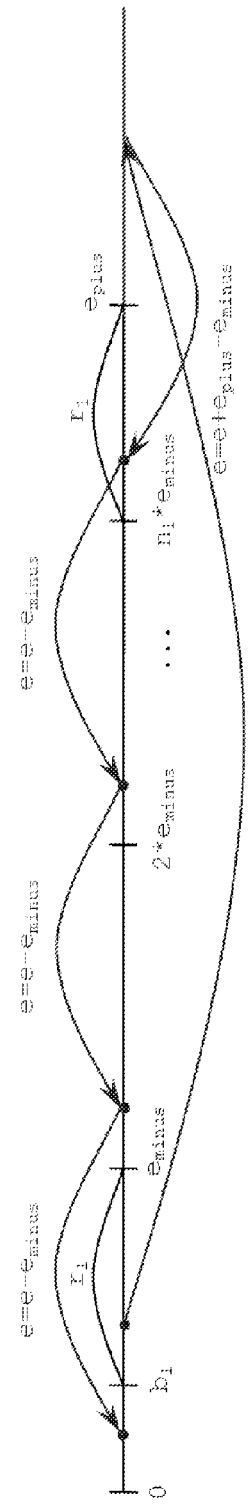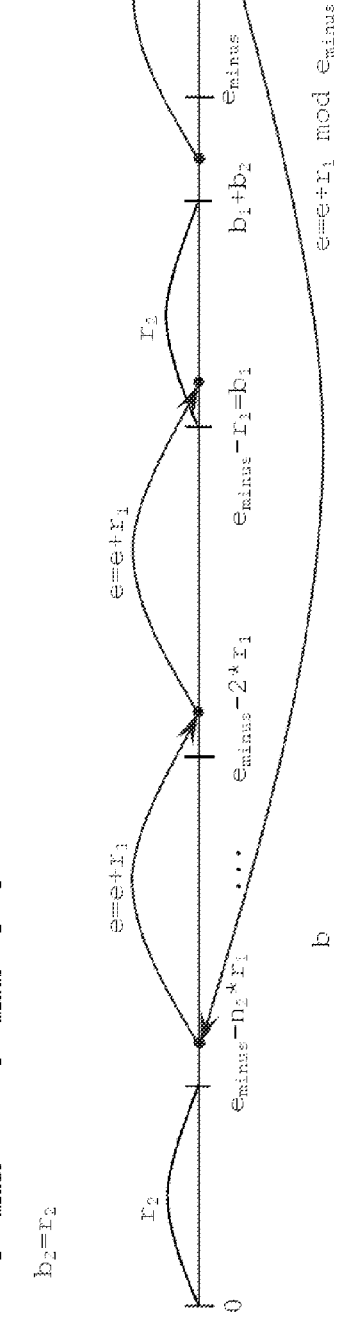

OPTIMIZATION OF DATA PROCESSORS WITH IRREGULAR PATTERNS

BACKGROUND OF THE INVENTION

Code Division Multiple Access (CDMA) is a channel access method used by radio communication technologies. CDMA enables signals to be multiplexed over the same channel by assigning each transmitter a code. The data bits are combined with a code so that the signal can only be intercepted by a receiver whose frequency response is programmed with the same code. The code changes at the chipping rate which is much faster than the original sequence of data bits. The result of combining the data signal with the code is a spread spectrum signal that resists interference and enables the original data to be recovered if the original data bits are damaged during transmission. CDMA technology optimizes the use of available bandwidth, and is used in communications such as ultra-high frequency cellular telephone systems.

Wideband CDMA (W-CDMA, or WCDMA) is an International Telecommunications Standard (ITU) derived from CDMA technology. The code in WCDMA technology is a wideband spread signal. WCDMA is found in communications such as 3G mobile telecommunications networks. WCDMA transmits on a pair of 5 MHz-wide carrier channels, whereas narrowband CDMA transmits on 200 kHz-wide channels. WCDMA has been developed into a complete set of specifications. Specifically, details on WCDMA multiplexing, channel coding, interleaving and rate matching are described in "3rd Generation Partnership Project (3GPP); Technical Specification Group Radio Access Network; Multiplexing and Channel Coding (FDD) (3GPP TS 25.212)", hereinafter referred to as "3GPP TS 25.212", 3GPP TS 25.212 defines channel coding (e.g., turbo coding), interleaving, and rate matching (through puncturing and repetition) methods.

In general, channel coding encodes a packet of traffic data to generate a packet of code bits. Turbo codes often systematically generate redundant data to messages, allowing a receiver (e.g., a base station or cellular handset) to detect and correct errors in a message without the need to ask the sender for additional data. Encoding might rely on an interleaver to receive input data, shuffle or re-order the input data, and provide the shuffled data as output data. Interleavers are employed in many wireless communication systems to reduce the impact of noise and interference on performance. For example, channel interleaving is commonly utilized to protect against a burst of errors due to noise and interference. At a transmitter, a channel interleaver shuffles code bits from a channel encoder so that consecutive code bits are spread apart in the interleaved bits. When a sequence of interleaved bits is involved in a burst of errors, these interleaved bits are spread apart after the complementary reshuffling by a channel de-interleaver at a receiver. Thus, interleaving breaks temporal correlation between successive bits involved in a burst of errors, which may improve overall system performance. The process of channel coding and interleaving, however, might result in blocks of coded data that have inconvenient size or width with respect to the supported channel rates. In order to match encoded and interleaved data with channel transmission rates, rate matching is employed to increase or decrease (expand or compress) the blocks of encoded data.

As the WCDMA standard is now employed in most modern wireless or cellular devices, efficient implementation of the standard has high priority for manufacturers of these devices (especially for processing speed and power consumption aspects), and manufacturers of base stations for them. Many methods for implementation of the standard's protocol cases exist (e.g. in software, hardware, firmware, etc.) Each case has its own specific implementation and ways of improving resulting performance, but all of them require efficient methods to implement various parts of the proposed protocols. Downlink encoding chains for general transport channels and high speed (HS) transport channels include a number of transformations. One of the most complex and time-consuming transformations of these chains is rate matching. The rate matching method in a WCDMA downlink consists of compressing or expanding of input bit stream into output bit stream of the specified length by means of puncturing of some bits in the case of compression and by means of repetition of some bits in the case of expanding. The patterns of puncturing and repetition are defined in a basic method described in technical specification 3GPP TS 25.212, section 4.2.7.5 (V9.1.0, December 2009). A main disadvantage of this basic method is that it doesn't define pattern regularly over whole input word, but rather each punctured or repeated bit is determined only at next iteration of the method (using current data processor state). This results in low throughput in a case when each iteration of the method processes only a small number of bits.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention provides for rate matching of a data stream within a transmitter. The stream of data that is subject to at least one type of modification is provided to a processor. A long pattern and a short pattern for each of one or more iterations are defined, based on the at least one type of modification, each long pattern and each short pattern i) constructed from the long pattern and the short pattern of at least one prior iteration, ii) each long pattern of an iteration longer, in length, than the long pattern of the prior iteration, and iii) each short pattern of an iteration longer, in length, than the short pattern of the prior iteration. Beginning with a current iteration corresponding to the longest length long pattern and the longest length short pattern, and repeating for each subsequent iteration corresponding to successively shorter length long and short patterns, the stream of data is processed. For a current iteration, the processor identifies at least one partial data transformation within portions of the stream of data based on the long pattern and the short pattern for the iteration and based on a state of the processor, wherein each partial data transformation comprises substituting a corresponding bit pattern for the portion of the stream of data. The processor applies the partial data transformation for the corresponding identified bit pattern to the corresponding portion of the stream of data, and updates the state of the processor for the iteration. The processor repeats the identifying, applying and updating steps for the current iteration and for each subsequent iteration, if any, until the data stream is processed.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 2 shows transitions of the error modification of FIG. 1 via substitution of predefined values;

FIG. 4 shows transitions of the error modification of FIG. 3 via substitution of predefined values;

DETAILED DESCRIPTION

Figure 1:
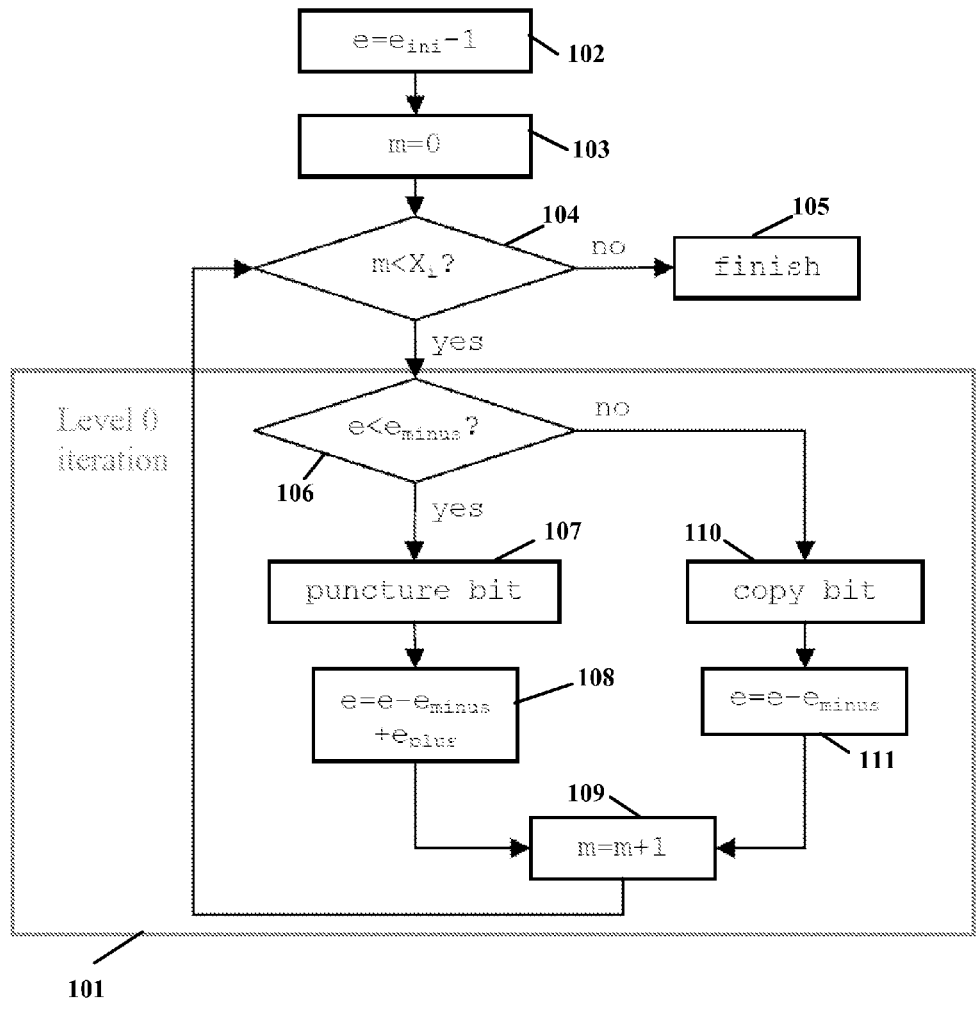
FIG. 1 shows a decision process including a 0-level iteration for puncturing on the current bit transformation as employed by an exemplary embodiment of the present invention.

In accordance with exemplary embodiments of the present invention, data streams with irregular patterns are processed by transformations defined by recursively changing processor state. The data transformations are applied to an arbitrary long portion of data, instead of small portions, that are defined directly by a current processor state. Embodiments combine small parts of, for example, puncturing/repetition patterns into a pattern of bigger parts and apply these patterns of bigger parts to relatively large portions of input data.

Embodiments of the present invention might be employed as a part of a WCDMA standard relating to encoding of user information in transport channels in a downlink ultimately transferred to a receiver that reverses the processing to recover the original data corresponding to the user information. For exemplary embodiments, applicable to WCDMA rate matching methods, throughput constraints are reduced or eliminated by the transformation pattern. While implementation of the basic WCDMA rate matching method described in the 3GPP TS 25.212 standard might result in 2 or even 1 processed bits per iteration, embodiments of the present invention process any number of bits per iteration (defined by a parameter). Embodiments of the present invention might be applied to both a general channel rate matching method of the standard and to a hybrid, ARQ functionality for HS transport channels. The present invention might be applied to both puncturing and repetition modes of these methods.

Exemplary embodiments of the present invention are now described for a WCDMA rate matching method, such as described in the technical specification 3GPP TS 25.212, section 4.2.7.5 (V9.1.0, December 2009), optimized using a process of a number of optimization levels. As employed herein, the term "0-level method" refers to the initial version of the method described in the original technical specification, the term "1-level method" refers to the first level of the optimization process including a 1-level iteration, defined subsequently, the term "ith-level method" refers to the ith level of the optimization process (having a "ith-level iteration"), and so on until a maximum level, N. Processing of data using a process with a number of optimization levels in accordance with embodiments of the present invention includes both processes: puncturing and repetition.

Puncturing

For puncturing, the following pseudo-code provides data processing in accordance with the standard, the 0-level method, in accordance with an exemplary embodiment of the present invention, where $e_{ini}$ (initial error), $X_i$ (input length), $e_{plus}$ (error+update), $e_{minus}$ (error−update) are the input parameters to the method.

```
e = e_ini     (set error to initial error between current and desired puncturing
              ratio)
m = 1         (a counter representing the index of the current bit)
do while m <= X_i
    e = e − e_minus      (update error)
    if e <= 0 then       (check if bit number m should be punctured)
        set bit x_{i,m} to δ where δ ∉ {0, 1}   (puncture the bit)
        e = e + e_plus                          (update error)
    end if
    m = m + 1 (advance to next bit)
end do
```

The decision of the 0-level method on the current bit transformation (to keep or to puncture the bit) is made using only the one, non-constant parameter 'e', the error between the current and desired ratio, so, 'e' can be treated as current data processor (or method) state. The process, the 0-level method, includes a component that might be rewritten and defined as a 0-level iteration. Shown as the method portion 0-level iteration 101 in FIG. 1 (in the figure, substitute 'e' 'e−1.' in the pseudo-code above).

FIG. 1 shows a decision process of the 0-level method including a 0-level iteration 101 for puncturing on the current bit transformation as employed by an exemplary embodiment of the present invention. When the first bit is received, at step 102, the initial error, e, is set as $e_{ini}$−1, and the counter n (bit counter) initialized at step 103. At step 104, a test determines if all bits have been processed and, if so, at step 105, the process finishes. If the test of step 104 determines that all bits have not been processed, the method advances to step 106 of 0-level iteration 101. At step 106, a test determines of the current error is less than $e_{minus}$. If the test of step 106 determines that the current error is less than $e_{minus}$, then the current bit is punctured at step 107, the error is updated at step 108, and the bit counter n is updated at step 109. If the test of step 106 determines that the current error is not less than $e_{minus}$, then the current bit is copied at step 110, the error is updated at step 111, and the bit counter n is updated at step 109. From step 109, the process returns to step 104 and the process continues until all bits are processed.

The pattern generated by 0-level iteration 101 in FIG. 1 is similar to the following ++−++−+++−++−++−+++−++− ..., where '−' is defined as a punctured bit and '+' is defined as a copied bit. Examination of the 'e' value's error modification through repetitions of the 0-level iteration shows that a number of bits copied between two punctured bits varies no more than by 1, and that the value of 'e' is always greater than 0. If, for some current iteration, the value of 'e' belongs to the interval '[0,$e_{minus}$)' then the next bit is punctured. Consequently, the next error modification is 'e=e−$e_{minus}$+$e_{plus}$' (defined herein as a "1st type") followed by some number of error modifications of 'e=e−$e_{minus}$' (defined herein as a "2nd type"). The number of 2nd type modifications might be calculated as: '[(e−$e_{minus}$+$e_{plus}$)/$e_{minus}$]', which is equivalent to '[$e_{plus}$/$e_{minus}$]−1' or '[$e_{plus}$/$e_{minus}$]' depending on the current value of 'e'. Here '[x]' means the greatest integer value that less than or equal to x.

The transitions of the error modification might be illustrated as in FIG. 2 via substitution of defined values $n_1$, $r_1$ and $b_1$ where $n_1$ is defined as '[$e_{plus}$/$e_{minus}$]', $r_1$ is defined as '$e_{plus}$ mod $e_{minus}$'='$e_{plus}$−$n_1$*$e_{minus}$', and $b_1$ is defined as '$e_{minus}$−$r_1$'. As shown in FIG. 2, the number of 2nd type modifications is equivalent to '$n_1$'='[$e_{plus}$/$e_{minus}$]' if 'e>=$b_1$' and equivalent to '$n_1$−1' if 'e<$b_1$'. The value of 'e' after the 1st type modification and a number of 2nd type modifications belongs to the interval '[0,$e_{minus}$)' and might be calculated depending on the current value of 'e' using the relation 'e=e+$e_{plus}$−$n_1$*$e_{minus}$' or 'e=e+$e_{plus}$−($n_1$+1)*$e_{minus}$', which is equivalent to 'e=e+$r_1$ mod $e_{minus}$'.

Figure 3:
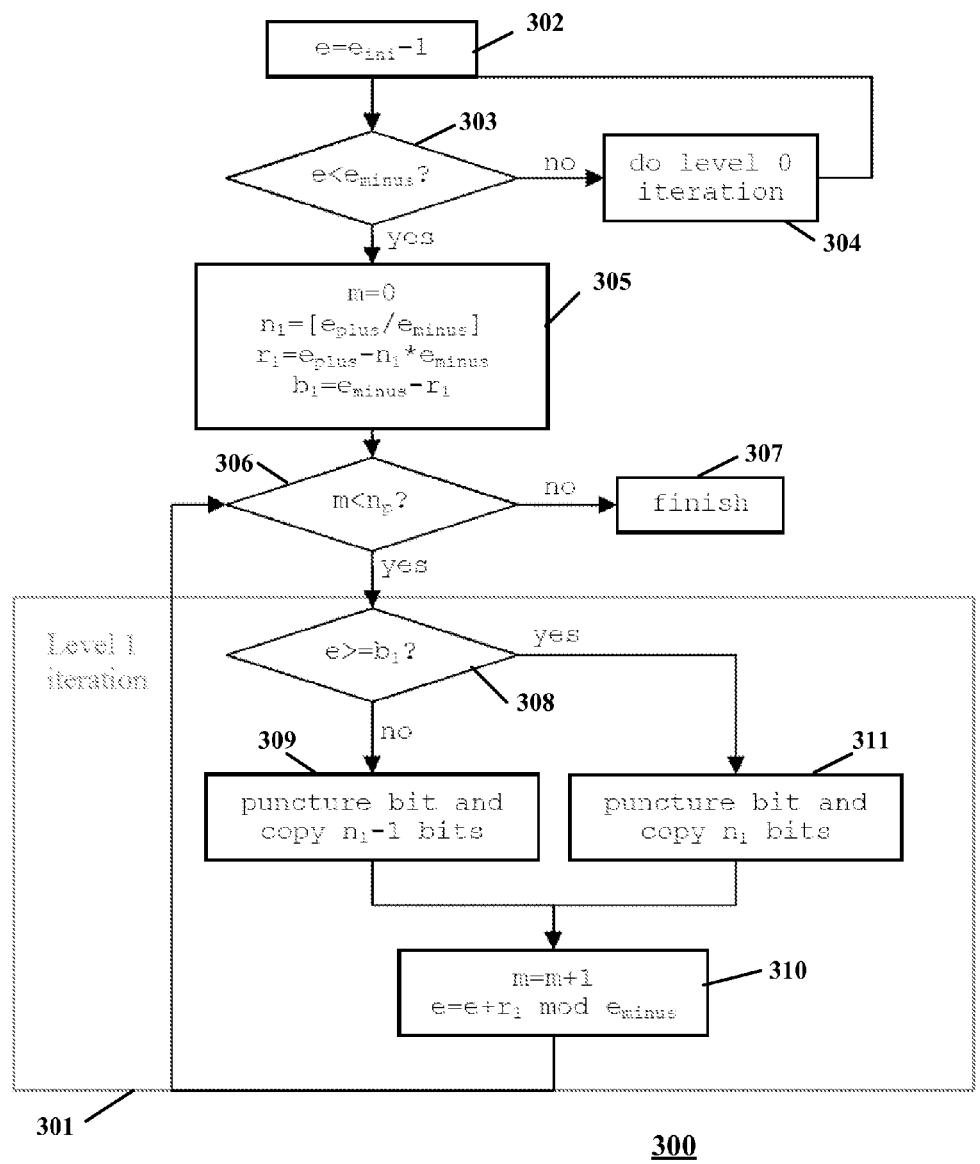
FIG. 3 shows a decision process including a 1-level iteration for puncturing on the current bit transformation as employed by the exemplary embodiment of the present invention.

FIG. 3 shows a decision process 300 including a 1-level iteration 301 on the current bit transformation as employed by the exemplary embodiment of the present invention (where $n_p$ is the number of bits to be punctured that can be calculated from input parameters). For this case of FIG. 3, the iteration of the method is a punctured bit and number of copied bits, yielding a pattern similar to the following: ++(−+++)(−++)(−++)(−+++)(−++) .... Patterns such as '−+++' (which have '$n_1$' copied bits) are denoted as 'l' (i.e., long) and patterns such as '−++' (which have '$n_1$−1' copied bits) are denoted as 's' (i.e., short). An exemplary pattern having this notation might be rewritten as follows: [++lssls ...].

Returning to FIG. 3, the decision process includes 1-level iteration 301 for puncturing on the current bit transformation. When the first bit is received, at step 302, the initial error, e, is set as $e_{ini}$−1. At step 303, a test determines of the current error e is less than $e_{minus}$. If the test of step 303 determines that the current error is not less than $e_{minus}$, then the process advances to step 304, and a 0-level iteration, such as the 0-level iteration 101 shown in FIG. 1, is performed before returning to step 303. If the test of step 303 determines that the current error is less than $e_{minus}$, then the counter m (bit counter) is initialized, and variables $n_1$, $r_1$ and $b_1$ set to initial values based on the parameters $e_{plus}$ and $e_{minus}$ at step 305.

At step 306, a test determines if m is less than the number of punctured bits $n_p$. If the test at step 306 determines m is not less $n_p$, then, at step 307, the process finishes. If the test of step 306 determines m is less than $n_p$, then the method advances to step 308 of 1-level iteration 301. A test at step 308 determines whether the current error is greater than or equal to $b_1$. If the test of step 308 determines the current error is not greater than or equal to $b_1$, then the current bit is punctured and next ($n_1$−1) bits are copied at step 309, and the method advances to step 310. If the test of step 308 determines that the current error is greater than or equal to $b_1$, then, at step 311, the current bit is punctured and next $n_1$ bits are copied, and then the method advances to step 310. At step 310, the error is updated and the bit counter m is updated. From step 310, the process returns to step 306 and the process continues until all bits are processed.

Figure 5:
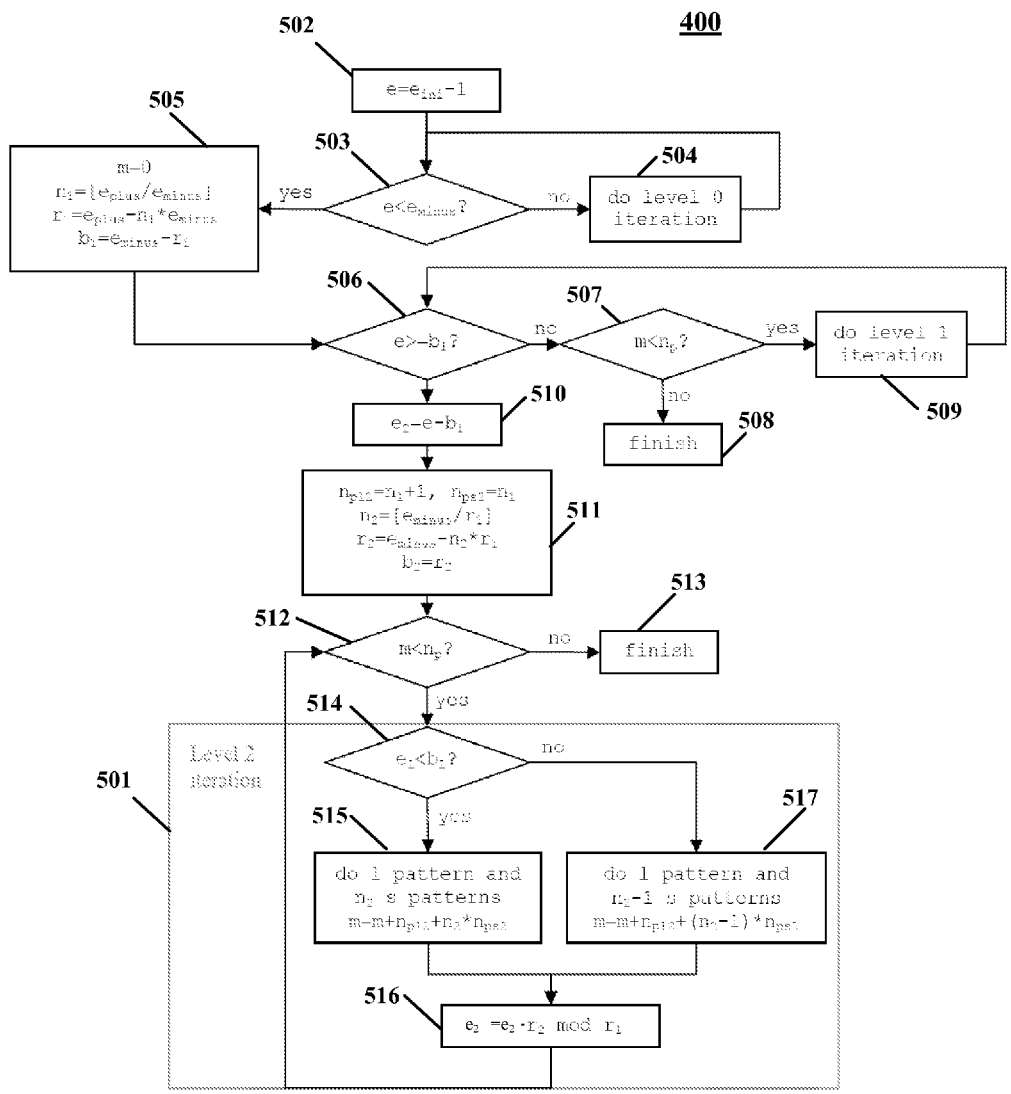
FIG. 5 shows a decision process including a 2-level iteration for puncturing on the current bit transformation as employed by the exemplary embodiment of the present invention.

For this case, a pattern exists in which one long iteration is performed and some number of short iterations are performed. Similar to the case of 0-level iteration described above with respect to FIGS. 1 and 2, the transitions of the error modification of FIG. 3 might be illustrated as in FIG. 4 via substation of defined values $e_2$, $n_2$, $r_2$ and $b_2$, where $e_2$ is defined as e−$b_1$, $n_2$ is defined as '[$e_{minus}$/$r_1$]', $r_2$ is defined as '$e_{minus}$ mod $r_1$'='$e_{minus}$−$n_2$*$r_1$', and $b_2$ is defined as '$r_2$'. As shown in FIG. 4, a number of 's' iterations is equivalent to '$n_2$=[$e_{minus}$/$r_1$]' if '$e_2$=e−$b_1$<$b_2$' and equivalent to '$n_2$−1' if '$e_2$>=$b_2$'. Also from FIG. 4, the value of 'e' after an 'l' pattern and a number of 's' patterns belongs to the interval '[$b_1$, $e_{minus}$)' or, equivalently, '$e_2$=e−$b_1$' belongs to the interval '[0,$r_1$)' and might be calculated as '$e_2$=$e_2$−$r_2$ mod $r_1$', FIG. 5 shows a decision process 500 on the current bit transformation as employed by the exemplary embodiment of the present invention. Now, the 2-level iteration of the method is an 'l' pattern and a number of 's' patterns. The pattern appears as [++ ss (lss)(lsss)(lss)(lss)(lsss) ... ]. As defined herein, patterns such as 'lsss' (which have '$n_2$' 's' patterns) are denoted as 'L' (i.e., long) and patterns such as 'lss' (which have '$n_2$−1' 's' patterns) are denoted as 'S' (i.e., short). An exemplary pattern employing this notation might be rewritten as [++ssSLSSL ...].

As shown in FIG. 5, the decision process includes 2-level iteration 501 for puncturing on the current bit transformation. When the first bit is received, at step 502, the error, e, is set as $e_{ini}$−1. At step 503, a test determines of the current error e is less than $e_{minus}$. If the test of step 303 determines that the current error is not less than $e_{minus}$, then the process advances to step 504, and a 0-level iteration, such as the 0-level iteration 101 shown in FIG. 1, is performed before returning to step 503. If the test of step 503 determines that the current error is less than $e_{minus}$, then the counter in (bit counter) is initialized, and variables $n_1$, $r_1$ and $b_1$ set to initial values based on the errors $e_{plus}$ and $e_{minus}$ at step 505.

At step 506, a test determines whether the current error is greater than or equal to $b_1$. If the test of step 506 determines that the current error e is not greater than or equal to $b_1$, then the method advances to step 507. At step 507, a test determines if m is less than the number of punctured bits $n_p$. If the test at step 507 determines in is not less $n_p$, then, at step 508, the process finishes. If the test of step 507 determines m is less than $n_p$, then the method advances to step 509 to perform a 1-level iteration (such as 1-level iteration 301), and the process returns to step 506.

If the test of step 506 determines the current error is greater than or equal to $b_1$, then the method advances to step 510. At step 510, the level's error $e_2$ is generated. At step 511, variables $n_2$, $r_2$ and $b_2$ are set to initial values, and long and short pattern lengths ($n_{pl2}$ and $n_{ps2}$) generated. At step 512, a test determines if m is less than the number of punctured bits $n_p$. If the test at step 512 determines m is not less $n_p$, then, at step 513, the process finishes. If the test of step 512 determines m is less than $n_p$, then the method advances to step 514 of 2-level iteration 501. A test at step 514 determines whether the level's error $e_2$ is less than $b_2$. If the test of step 514 determines the level's error $e_2$ is less than $b_2$, the counter m is updated (based on $n_2$ and $n_{pl2}$ and $n_{ps2}$) and then one long l pattern followed by $n_2$ short s patterns are inserted at step 515, and the method advances to step 516. If the test of step 514 determines that the level's error $e_2$ is greater than or equal to $b_2$, the counter m is updated (based on ($n_2$−1) and $n_{pl2}$ and $n_{ps2}$) and then one long l pattern followed by ($n_2$−1) short s patterns are inserted at step 517, and the method advances to step 516. At step 516, the level's error $e_2$ is updated as '$e_2$=$e_2$−$r_2$ mod $r_1$' as described above. From step 516, the process returns to step 512 and the process continues until all hits portions of length $n_p$ are processed.

Figure 6:
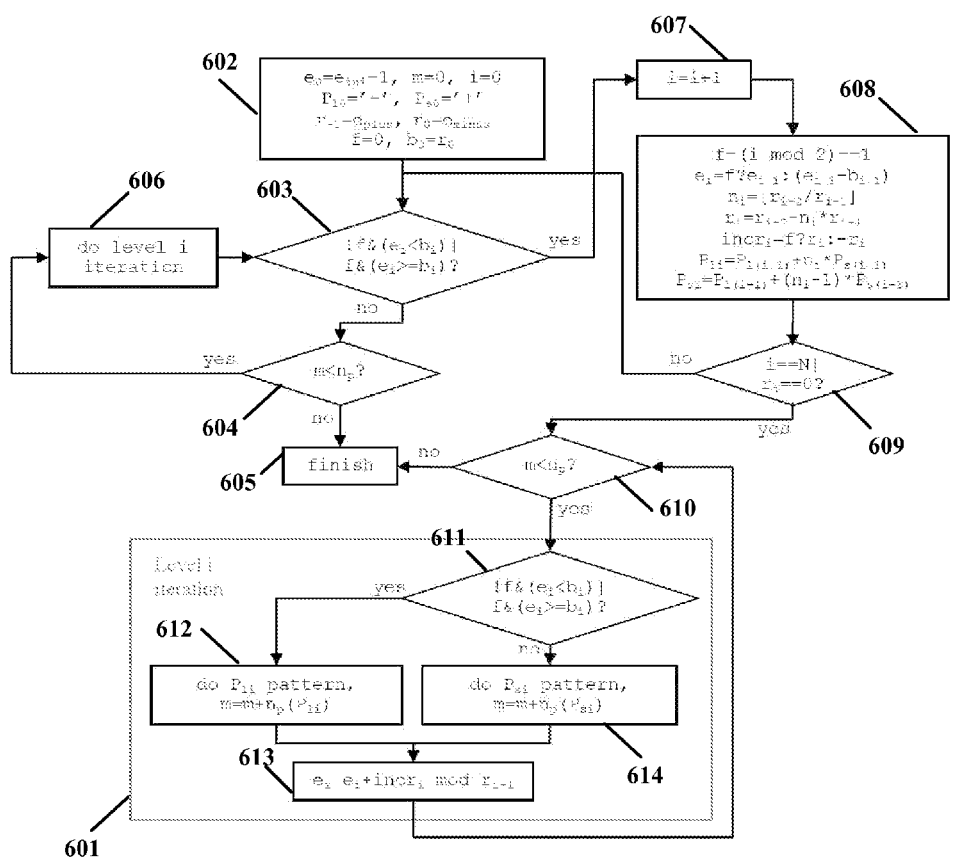
FIG. 6 shows a decision process including an ith-level iteration for puncturing on the current bit transformation as employed by the exemplary embodiment of the present invention.

A further, ith level iteration of the puncturing process is constructed in a similar manner to that of the (i−2)th level. Consequently, there are two level types, even and odd levels, which are identified and accounted for. Since the examples described above account for both the ith and (i+1)th level types of iterations, the process can be generalized for any level iteration. FIG. 6 shows a generalized method 600 for the decision process for an Nth-level process on the current bit transformation as employed by the exemplary embodiment of the present invention. In the figures, the "sum" of patterns such as '−−++' and '+−−' is defined as a concatenation of these patterns and '$n_p(P)$' is defined as the number of punctured bits '−' in pattern 'P'. Previously, in 1-level and 2-level iterations, '$r_1$' is generally not zero. However, if on some level '$r_1$' is a '0', then that pattern is regular, such as [++ssS(LSS)$^m$ ... ], and does not change until the end of input word. Consequently, a higher level of optimization is not necessarily required.

Referring to FIG. 6, at step 602, the values for the 0-th level error ($e_0$) in puncturing ratio, counter m, level counter i, 0-level long and short pattern ($P_{l0}$, $P_{s0}$), "f" flag employed to identify level type) and remainders $r_0$, $r_{−1}$ based on $e_{plus}$ and $e_{minus}$ are initialized. A test of step 603 determines the current relation between error $e_i$, and the value $b_i$, (depending on the level type, even or odd, indicated by the current value of "f", the error, $e_i$, is either less than the value $b_i$ or greater than or equal to the value $b_i$ for the test to be met). If the test of step 603 is not met, the method advances to step 604. At step 604, a test determines if counter m is less than $n_p$. If the test of step 604 determines counter m is not less than $n_p$, indicating that the entire input word is processed, then the method finishes at step 605. If the test of step 604 determines counter m is less than $n_p$, indicating that the input word is not yet processed, then the method advances to step 606 to perform a current level (i-th level) iteration of pattern puncturing, as defined by block 601 described subsequently. From block 606, the method returns to step 603.

If the test of step 603 is met, the method advances to step 607. At step 607, the current level "i" counter value is incremented by 1. At step 608, each (new) ith level's values $e_i$, $n_i$, $r_i$ and $b_i$, f, long and short patterns ($P_{li}$, $P_{si}$), long and Short pattern lengths ($n_{pli}$ and $n_{psi}$) and various counters and increments are updated and generated. At step 609, a test determines the target level (level N) is reached or if '$r_i$' is a '0' (indicating that the pattern is regular). If no, then the method returns to step 603; otherwise, the method advances to step 610.

At step 610, a test determines whether m is less than $n_p$. If the test at step 610 is "no", indicating that the entire input word is processed, then, at step 605 the process ends. If the test of step 610 is "yes", at step 611, the (i)th level iteration processing begins. A test of step 611 determines the current relation between error $e_i$, and the value $b_i$, (depending on the level type indicated by the current value of "f", the error, $e_i$, is either less than the value $b_i$ or greater than or equal to the value $b_i$ for the test to be met). If the test of step 611 determines the test is met, at step 612, the counter m is updated (based on long punctured pattern length $n_p(P_{li})$) and the long $P_{li}$ pattern is inserted, and the method advances to step 613. If the test of step 611 determines the test is not met, at step 614, the counter m is updated (based on short punctured pattern length $n_p(P_{si})$) and the short $P_{si}$ pattern is inserted, and the method advances to step 613. At step 613, the level's error $e_i$ is updated as '$e_i=e_i+incr_i \mod r_{i-1}$', where $incr_i$ is related to $r_i$, as described above in step 608. From step 613, the process returns to step 610 and the process continues until all bit portions of length $n_p$ are processed.

The flow of FIG. 6 at a single invocation of method 600 might be summarized, as follows. First the method repeats some number of times (possibly 0) through the 0-level iteration, then through the 1-level iteration, 2-level iteration, and so on. Finally, the method advances to the final i-th level iteration (steps 611 through 614 in block 601) due to the specified condition (block 609) and loops in the highest i-th level iteration until the end (i.e., method 600 stops when the processing of the input word finishes). Normally, in an implementation, the 0, 1, 2, . . . , and (i−1)th-level iterations are invoked a few times and the last i-th level iteration is executed many times.

Repetition

For repetition, the following pseudo-code provides data processing in accordance with the standard, including a 0-level method in accordance with an exemplary embodiment of the present invention, where $e_{ini}$(initial error), $X_i$(input length), $e_{plus}$(error+update), $e_{minus}$(error−update) are the input parameters to the method.

```
e = e_ini       (set initial error between current and desired repetition ratio)
m = 1           (a counter representing the index of the current bit)
do while m <= X_i
    e = e − e_minus        (update error value)
    do while e <= 0        (check if bit number m should be repeated)
        repeat bit x_i,m
        e = e + e_plus    (update error value)
    end do
    m = m + 1              (advance to next bit)
end do
```

Figure 7:
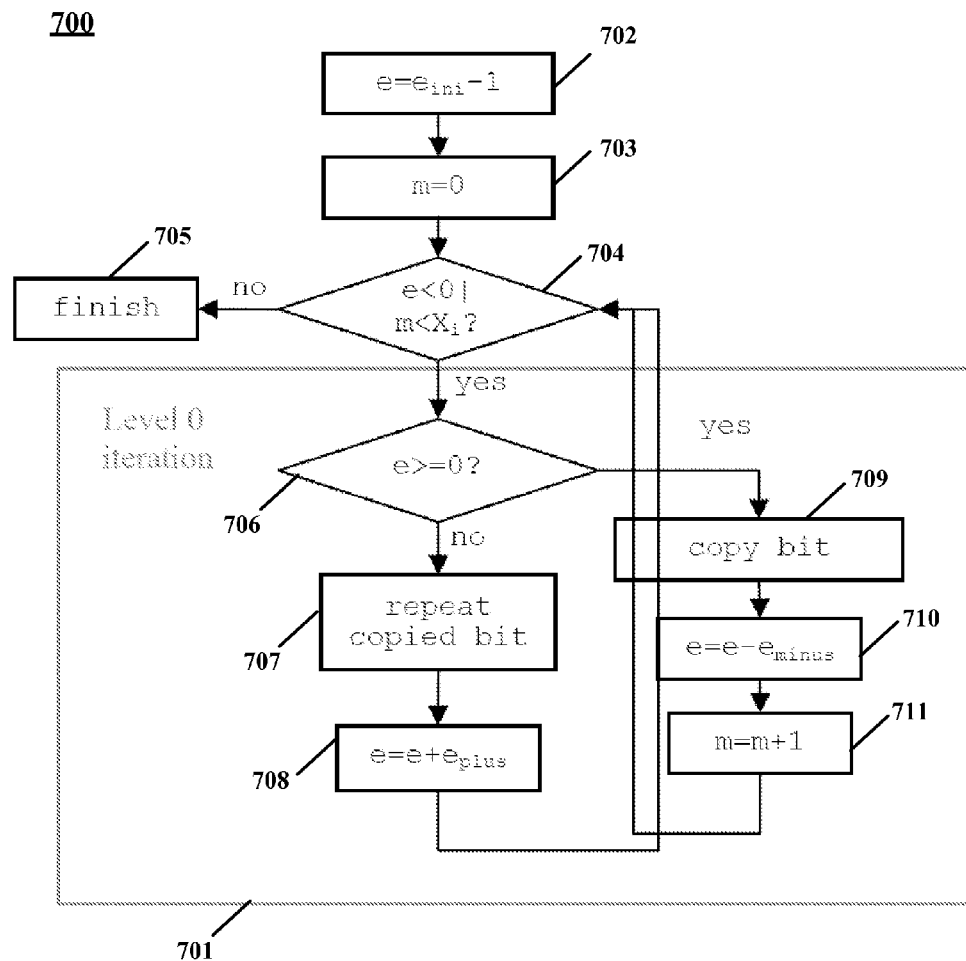
FIG. 7 shows a decision process including a 0-level iteration for repetition on the current bit transformation as employed by an exemplary embodiment of the present invention.
Figure 8:
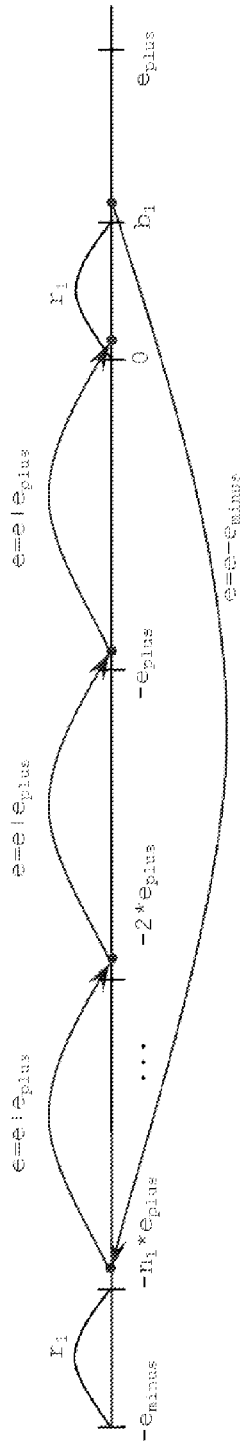
FIG. 8 shows transitions of the error modification of FIG. 7 via substitution of predefined values.

The process including the portion 0-th level iteration 701 for repetition might be rewritten as shown in FIG. 7 (in the figure, substitute 'e' as 'e−1' in the pseudo-code above). Generation of the repetition method with optimized levels occurs in a manner analogous to that described above for puncturing. The pattern of 0-level iteration appears as [++*++ *+* ... ] where is now defined as a copied bit and '*' means repeated bit. Similar to the process for puncturing, a number of repeated bits after 1 copied bit might vary by no more than 1 and is equal to '$n_1=[e_{minus}/e_{plus}]$' or '$n_1+1$]'. If the current 'e' value is less than '$b_1$' then the number of repeated bits is equivalent to '$n_1+1$'; otherwise, the number of repeated bits is equivalent to '$n_1$', such as shown in FIG. 8. Update of the 'e' value after each copied bit might be calculated as: '$e=e−r_1$ mode $e_{plus}$'.

FIG. 7 shows decision process 700 including a 0-th level iteration 701 for repetition on the current bit transformation as employed by an exemplary embodiment of the present invention. When the first bit is received, at step 702, the initial error, $e_{ini}−1$, is set, and the counter n (bit counter) initialized at step 701. At step 704, a test determines if the current error, e, is not less than 0 and all bits have been processed and, if so, at step 705, the process finishes. If the test of step 704 determines that the current error, e, is less than 0 or there is some bits to process, the method advances to step 706 of 0-level iteration 701. At step 706, a test determines whether the current error is greater than or equal to 0. If the test of step 706 determines that the current error is not greater than or equal to 0, then previously copied bit is repeated at step 707, and the error is updated at step 708. If the test of step 706 determines that the current error is greater than or equal to 0, then the current bit is copied at step 709, the error is updated at step 710, and the bit counter n is updated at step 711. From either step 708 or step 711, the process returns to step 704 and the process continues until all bits are processed.

Figure 9:
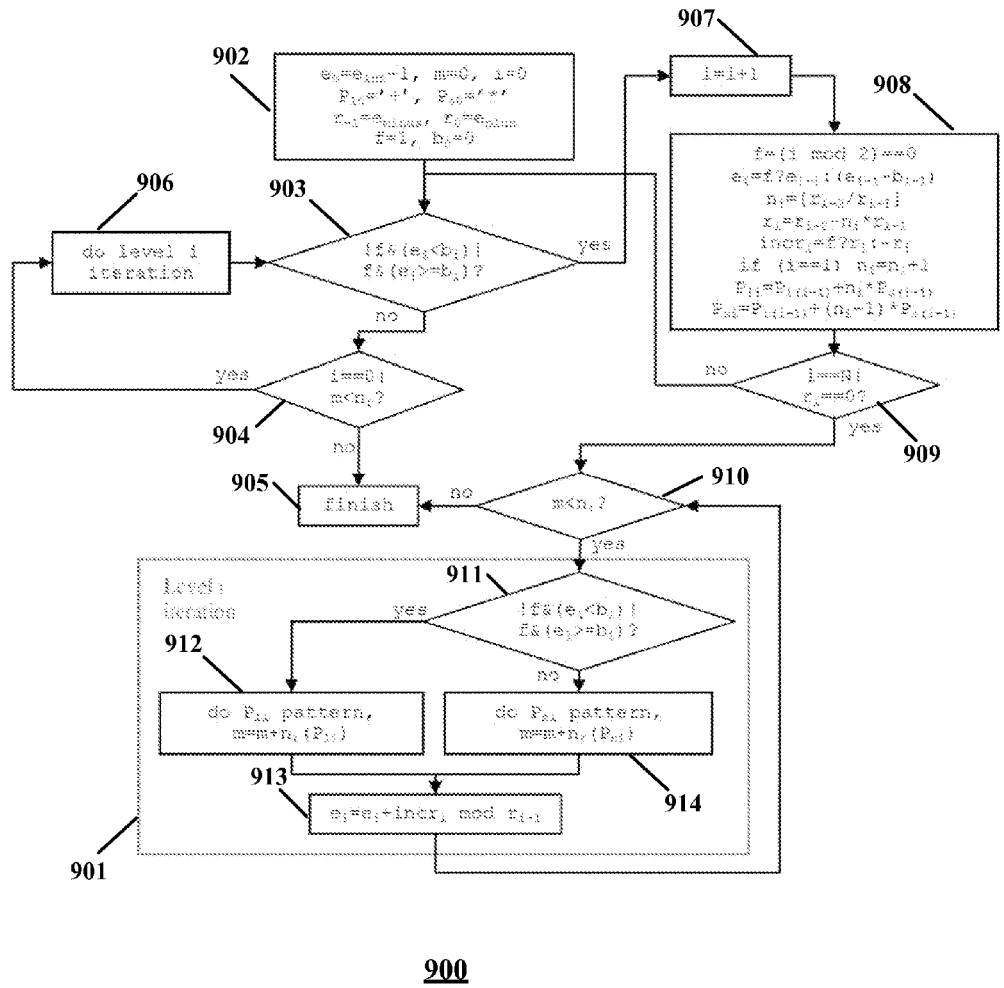
FIG. 9 shows a decision process including an ith-level iteration for repetition on the current bit transformation as employed by the exemplary embodiment of the present invention.

An arbitrary Nth level iteration for method 900 of the decision process might be implemented as shown in FIG. 9 (similar to that described above for FIG. 6). In FIG. 9, '$n_e$' is number of bits to repeat (as calculated from input parameters), the sum of patterns such as '++' and '+*' is a concatenation of these patterns, and '$n_j(P)$' is number of repetitions '*' in pattern 'P'. The diagrams for puncturing and repetition differ only in initial patterns, initial parameters, the process of flag 'f' computation, and the process of pattern definition as applied to the input stream. Thus, both processes might easily be implemented with a single portion of software code or hardware device.

Referring to FIG. 9, at step 902, the values for the 0-th level error ($e_0$) in repetition ratio (for repetition, this is an actual to desired length ratio since insertion only occurs), counter m, level counter i, 0-level long and short pattern ($P_{l0}$, $P_{s0}$), "f" (a flag employed to identify level type, even or odd) and remainders $r_0$, $r_{-1}$ based on $e_{plus}$ and $e_{minus}$ are initialized. A test of step 903 determines the current relation between error $e_i$, and the value $b_i$, (depending on the level type indicated by the current value of "f", the error, $e_i$, is either less than the value $b_l$ or greater than or equal to the value $b_l$ for the test to be met). If the test of step 903 is not met, the method advances to step 904. At step 904, a test determines if counter m is less than $n_e$. If the test of step 904 determines counter m is not less than $n_p$, indicating that the entire input word is processed, then the method finishes at step 905. If the test of step 904 determines counter m is less than $n_e$, indicating that the input word is not yet processed, then the method advances to step 906 to perform a current level (i-th level) iteration of pattern repetition, as defined by block 901 described subsequently. From block 906, the method returns to step 903.

If the test of step 903 is met, the method advances to step 907. At step 907, the current level "i" counter value is incremented by 1. At step 908, each (new) ith level's values $e_i$, $n_i$, $r_i$ and $b_i$, f, long and short patterns ($P_{li}$, $P_{si}$), long and short pattern lengths ($n_{sli}$ and $n_{csi}$) and various counters and increments are updated and generated. At step 909, a test determines the target level (level N) is reached or if '$r_i$' is as '0' (indicating that the pattern is regular). If no, then the method returns to step 903; otherwise, the method advances to step 910.

At step 910, a test determines whether to is less than $n_i$. If the test at step 910 is "no", indicating that the entire input word is processed, then, at step 905 the process ends. If the test of step 910 is "yes", at step 911, the (i)th level iteration processing begins. A test of step 911 determines the current relation between error $e_i$, and the value $b_i$, (depending on the level type indicated by the current value of "f", the error, $e_i$, is either less than the value $b_l$ or greater than or equal to the value $b_l$ for the test to be met). If the test of step 911 determines the test is met, at step 912, the counter in is updated (based on long repetition pattern length $n_r(P_{li})$) and the long $P_{li}$ pattern is inserted, and the method advances to step 913. If the test of step 911 determines the test is not met, at step 914, the counter in is updated (based on short repetition pattern length $n_p(P_{si})$) and the short $P_{si}$ pattern is inserted, and the method advances to step 913. At step 913, the level's error $e_i$ is updated as '$e_i = e_i + incr_i \mod r_{i-1}$', where $incr_i$ is related to $r_i$, as described above in step 908. From step 913, the process returns to step 910 and the process continues until all bit portions of length $n_f$ are processed.

Figure 10:
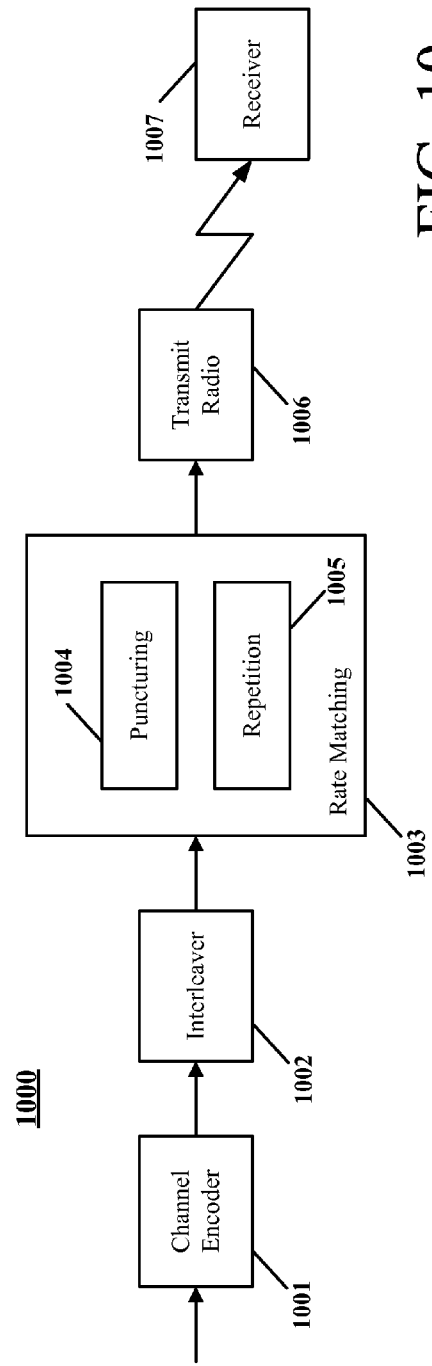
FIG. 10 shows a block diagram of a transmitter and receiver of a WCDMA communication system employing one or more embodiments of the present invention.

FIG. 10 shows a block diagram of a transmitter and receiver of a WCDMA communication system employing one or more embodiments of the present invention. As shown in FIG. 10, raw input data is encoded by channel encoder 1001 in accordance with, for example, a 3GPP wireless transmission standard. Encoded data is applied to interleaver 1002, which applies interleaving to the encoded data. The encoded, interleaved data is then applied to rate matching module 1003 including puncturing 1004 and repetition 1005 modules operating on the input with a process in accordance with one or more embodiments of the present invention, such as described above. The rate matched output is then applied through subsequent processing and modulated for transmission through a wireless medium by transmit radio 1006. Transmit radio 1006 then transmits the modulated signal through the wireless medium to receiver 1007, which demodulates, removes rate matching, de-interleaves and decodes the data in a substantially mirror-like fashion to the steps performed by the transmitter.

While exemplary embodiments are described herein with respect to a WCDMA rate matching method, one skilled in the art might extend the teachings herein to any other similar defined data processing method when stable throughput is necessary for long input words. For example, if a guaranteed throughput of 'M' bits per iteration is desired, a level of the method might be increased until a length of the pattern $P_{si}$ reaches the specified threshold 'M'. For different input words, reaching the specified threshold might occur at different levels of method. However, one skilled in the art might show that a number of changed levels is not greater than log 2M, since each level increases the pattern in at least 2 times. A complexity of each iteration doesn't increase from level to level, assuming that a computation device employed has enough instruction width to handle wide patterns (i.e., read M bits from the input data and apply an M-bit pattern).

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments of the present invention have been described with respect to processes of circuits, including possible implementation as a single integrated circuit, a multi-chip module, a single card, or a multi-card circuit pack, the present invention is not no limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

It will be further understood that various changes in the details, materials, and arrangements of the pans which have been described and illustrated in order to explain the nature of this invention may be made by those skilled in the art without departing from the scope of the invention as expressed in the following claims.

We claim:

1. A method of rate matching of a data stream within a transmitter, the method comprising:
   providing the stream of data subject to at least one type of modification to a processor;
   defining, based on the at least one type of modification, a long pattern and a short pattern for each of one or more iterations, each long pattern and each short pattern i) constructed from the long pattern and the short pattern of at least one prior iteration, ii) each long pattern of an iteration longer, in length, than the long pattern of the prior iteration, and iii) each short pattern of an iteration longer, in length, than the short pattern of the prior iteration;
   beginning with a current iteration corresponding to the longest length long pattern and the longest length short pattern and repeating for each subsequent iteration corresponding to successively shorter length long and short patterns until the stream of data is processed:
      identifying, by the processor, at least one partial data transformation within portions of the stream of data based on the long pattern and the short pattern for the iteration and based on a state of the processor, wherein each partial data transformation comprises substituting a corresponding bit pattern for the portion of the stream of data;
      applying the partial data transformation for the corresponding identified bit pattern to the corresponding portion of the stream of data;
      updating the state of the processor; and
      repeating the identifying, applying and updating steps for the current iteration.

2. The method of claim 1, wherein the at least one modification is selected from the group consisting of puncturing, copying and repetition.

3. The method of claim 2, further comprising transmitting the processed stream of data to a receiver.

4. The method of claim 1, wherein:
   each long pattern and each short pattern for iteration i, i an integer greater than 1, is constructed from the long pattern and the short pattern of iteration (i−2).

5. The method of claim 1, wherein updating the state of the processor comprises updating a current bit count of the stream of data and at least one error value related to a current partial data transformation and a desired partial data transformation for the corresponding iteration.

6. The method of claim 1, wherein a length of each portion of the stream of data for an iteration that is processed by the step of applying the partial data transformation is related to a number of bits for a type of modification within each long pattern and each short pattern for the corresponding iteration.

7. The method of claim 1, wherein the method is embodied in a processing module of a wireless device.

8. The method of claim 7, wherein the method is embodied in the processing module of the wireless device operating in accordance with a 3GPP wireless communication standard.

9. An apparatus for rate matching of processed data within a transmitter, the apparatus comprising:
   a processor provided a stream of data subject to at least one type of modification to the processor;
   wherein the processor defines, based on the at least one type of modification, a long pattern and a short pattern for each of one or more iterations, each long pattern and each short pattern i) constructed from the long pattern and the short pattern of at least one prior iteration, ii) each long pattern of an iteration longer, in length, than the long pattern of the prior iteration, and iii) each short pattern of an iteration longer, in length, than the short pattern of the prior iteration;

a rate matching module configured to, beginning with a current iteration corresponding to the longest length long pattern and the longest length short pattern and repeating for each subsequent iteration corresponding to successively shorter length long and short patterns until the stream of data is processed:
   identify at least one partial data transformation within portions of the stream of data based on the long pattern and the short pattern for the iteration and based on a state of the processor, wherein each partial data transformation comprises substituting a corresponding bit pattern for the portion of the stream of data;
   apply the partial data transformation for the corresponding identified bit pattern to the corresponding portion of the stream of data, and
   update the state of the processor.

10. The apparatus of claim 9, wherein the at least one modification is selected from the group consisting of puncturing, copying and repetition.

11. The apparatus of claim 9, further comprising a receiver configured to receive and convert the processed stream of data into the original stream of data.

12. The apparatus of claim 9, wherein:
each long pattern and each short pattern for iteration i, i an integer greater than 1, is constructed from the long pattern and the short pattern of iteration (i−2).

13. The apparatus of claim 9, wherein updating the state of the processor updates a current bit count of the stream of data and at least one error value related to a current partial data transformation and a desired partial data transformation for the corresponding iteration.

14. The apparatus of claim 9, wherein a length of each portion of the stream of data for an iteration that is processed by applying the partial data transformation is related to a number of bits for a type of modification within each long pattern and each short pattern for the corresponding iteration.

15. The apparatus of claim 9, wherein the processor is embodied in a wireless device.

16. The apparatus of claim 15, wherein the wireless device operates in accordance with a 3GPP wireless communication standard.

17. A non-transitory machine-readable storage medium, having encoded thereon program code, wherein, when the program code is executed by a machine, the machine implements a method for rate matching of a data stream within a transmitter, comprising the steps of:
   providing the stream of data subject to at least one type of modification to a processor;
   defining, based on the at least one type of modification, a long pattern and a short pattern for each of one or more iterations, each long pattern and each short pattern i) constructed from the long pattern and the short pattern of at least one prior iteration, ii) each long pattern of an iteration longer, in length, than the long pattern of the prior iteration, and iii) each short pattern of an iteration longer, in length, than the short pattern of the prior iteration;
   beginning with a current iteration corresponding to the longest length long pattern and the longest length short pattern and repeating for each subsequent iteration corresponding to successively shorter length long and short patterns until the stream of data is processed:
      identifying, by the processor, at least one partial data transformation within portions of the stream of data based on the long pattern and the short pattern for the iteration and based on a state of the processor, wherein each partial data transformation comprises substituting a corresponding bit pattern for the portion of the stream of data;
      applying the partial data transformation for the corresponding identified bit pattern to the corresponding portion of the stream of data;
      updating the state of the processor; and
      repeating the identifying, applying and updating steps for the current iteration.

* * * * *